(12) United States Patent
Weichart et al.

(10) Patent No.: US 8,268,142 B2
(45) Date of Patent: Sep. 18, 2012

(54) RF SPUTTERING ARRANGEMENT

(75) Inventors: Jürgen Weichart, Balzers (LI); Heinz Felzer, Landquart (CH)

(73) Assignee: OC Oerlikon Balzers AG, Balzers (LI)

( * ) Notice: Subject to any disclaimer, the term of this patent is extended or adjusted under 35 U.S.C. 154(b) by 349 days.

(21) Appl. No.: 12/644,596

(22) Filed: Dec. 22, 2009

(65) Prior Publication Data

US 2010/0155238 A1    Jun. 24, 2010

Related U.S. Application Data

(60) Provisional application No. 61/140,102, filed on Dec. 23, 2008.

(51) Int. Cl.
*C23C 14/35* (2006.01)

(52) U.S. Cl. .............. 204/298.14; 204/298.11
(58) Field of Classification Search ............. 204/298.11, 204/298.14
See application file for complete search history.

(56) References Cited

U.S. PATENT DOCUMENTS

| | | | |
|---|---|---|---|
| 3,514,391 A * | 5/1970 | Hablanian et al. ....... | 204/298.06 |
| 3,661,761 A | 5/1972 | Koenig | |
| 4,131,533 A | 12/1978 | Bialko et al. | |
| 4,619,755 A * | 10/1986 | Hessberger et al. ..... | 204/298.14 |
| 5,863,339 A | 1/1999 | Usami | |
| 6,358,376 B1 * | 3/2002 | Wang et al. .............. | 204/192.12 |

FOREIGN PATENT DOCUMENTS

| | | |
|---|---|---|
| DE | 3706698 A1 | 1/1988 |
| EP | 0003020 A2 | 7/1979 |
| EP | 1176625 A2 | 1/2002 |
| EP | 1746181 A2 | 1/2007 |
| GB | 2191787 A | 12/1987 |

OTHER PUBLICATIONS

International Search Report for PCT/IB2009/055870 dated May 20, 2010.

* cited by examiner

*Primary Examiner* — Rodney McDonald
(74) *Attorney, Agent, or Firm* — Pearne & Gordon LLP

(57) ABSTRACT

Apparatus for sputtering comprises a vacuum chamber, at least one first electrode having a first surface arranged in the vacuum chamber, a counter electrode having a surface arranged in the vacuum chamber and a RF generator. The RF generator is configured to apply a RF electric field across the at least one first electrode and the counter electrode so as to ignite a plasma between the first electrode and the counter electrode. The counter electrode comprises at least two cavities in communication with the vacuum chamber. the cavities each have dimensions such that a plasma can be formed in the cavity.

19 Claims, 6 Drawing Sheets

RF SPUTTERING ARRANGEMENT

The present invention relates to an arrangement for sputtering, in particular for sputtering by means of high frequency (HF) such as RF (radio frequency).

Sputtering apparatus may include an evacuatable chamber, commonly referred to as a vacuum chamber or plasma reactor, that includes at least two electrodes, between which a plasma can be formed. At least one of the electrodes provides the material to be sputtered and at least one other electrode provides a counter electrode. In RF sputtering, a high frequency voltage is applied between the two electrodes, which continuously alternates in respect of polarity.

It is observed that the electrode with the smaller electrode surface displays a preferential sputtering effect. Therefore, a smaller electrode is typically used as the electrode comprising material to be sputtered and a larger electrode is used as the counter electrode that is typically connected to ground.

The sputtering-off effect is however not completely limited to the smaller electrode area; the extent to which the larger electrode is affected by sputtering depends on the difference between the plasma potential and the potential of the larger electrode. If this difference exceeds the sputtering threshold, the larger electrode will also be sputtered. This is undesirable if the larger electrode comprises one or more elements which are not desired to be sputtered-off from the larger electrode and deposited onto the substrate.

In order to avoid this effect of sputtering from the larger electrode, the enclosure of the RF sputter arrangement (e.g. a vacuum chamber) may be used as the larger counter electrode. The ratio between smaller electrode area and larger counter electrode area can be 1:10 or higher which is observed to reduce sputtering from the larger electrode.

This design rule of 1:10 however has limits: Certain applications, e.g. the treatment of wafers with 30 cm diameter normally require a sputter target of 40 cm. The 1:10 rule would then result in a counter electrode area of more than 1 $m^2$, which is difficult to arrange in a vacuum sputter chamber.

GB 2 191 787 discloses an arrangement in which a magnetic field is applied at the counter electrode in order to enhance the effect of the counter electrode and reduce sputtering of the counter electrode. The ratio of the counter electrode area to the target electrode area can be reduced applying the magnetic field to the counter electrode. This enables a counter electrode of a smaller area to be used whilst still avoiding undesirable sputtering from the counter electrode.

However, this approach requires additional magnets which complicates the design and manufacture of the sputtering apparatus. Therefore, further arrangements for RF sputtering are desirable which also reduce the likelihood of sputtering of the counter electrode.

The application provides apparatus for sputtering, in particular, a RF (radio frequency) sputter arrangement, that comprises a vacuum chamber defined by at least one side wall, a base and a cover, at least one first electrode having a first surface arranged in the vacuum chamber, a counter electrode having a surface arranged in the vacuum chamber, and a RF generator. The RF generator is configured to apply a RF electric field across the at least one first electrode and the counter electrode, so as to ignite a plasma between the first electrode and the counter electrode. The counter electrode comprises at least two cavities in communication with the vacuum chamber. The cavities each have dimensions such that a plasma can be formed in the cavity.

The cavities of the counter electrode increase the surface area of the counter electrode over that of a counter electrode without these cavities. This increased surface area effectively increases the surface area of the counter electrode in comparison with the first electrode as the surface area defining the cavity may come into contact with the plasma as the cavity is dimensioned so that a plasma can be formed in each of the cavities. This reduces the likelihood of sputtering of material from the counter electrode which then be deposited onto the substrate being coated with material sputtered from the target.

In an embodiment, the counter electrode comprises at least a portion of the side wall and/or the base of the vacuum chamber and/or the cover of the vacuum chamber and one or more additional electrically conductive members.

In other words, the counter electrode comprises one or more additional electrically conductive members and at least a portion of at least one of the base, cover and side wall defining the vacuum chamber. The additional electrically conductive members and at least a portion of at least one of the base, cover and side wall defining the vacuum chamber may be formed so as to define one or more cavities in communication with the vacuum chamber that each have dimensions such that a plasma can be formed in the cavity.

In a further embodiment, the counter electrode is provided as a separate piece which is arranged within the vacuum chamber. The counter electrode may comprise a side wall frame and at least three additional electrically conductive members that define two or more cavities. The side wall frame and additional electrically conductive members that define the two or more cavities provide a counter electrode with a corrugated form that has a large surface area in comparison to the lateral size of the counter electrode.

In an embodiment, the counter electrode is arranged in peripheral regions of the vacuum chamber. This avoids interrupting the deposition path of material from the target onto the substrate if the additional electrically conductive member is arranged peripheral to the target and substrate. In a further embodiment, the counter electrode is arranged out of line of sight of the first electrode and the target to a substrate.

In an embodiment, the additional electrically conductive members protrude from the side wall frame and may protrude generally perpendicularly to the side wall frame. The additional electrically conductive members may be integral with the side wall frame or may be detachedly attached to the side wall frame or fixedly attached to the side wall frame.

In an embodiment, the number of cavities is defined by the formula the number of additional electrically conductive members −1. For example, if three additional electrically conductive members are provided, two cavities may be formed if the additional electrically conductive members are stacked one on top of the other so that they are spaced at a distance from their immediate neighbour or neighbours. In this example, a first cavity is formed between the lower electrically conductive member and the centre electrically conductive member and a second cavity is formed between the centre electrically conductive member and the upper additional electrically conductive member.

In further embodiments, the additional electrically conductive member or members are arranged generally parallel to the side wall frame rather than generally perpendicular to the side wall frame.

Some embodiments of the apparatus for sputtering comprise a counter electrode which comprises one or more electrically conductive members arranged generally parallel to the side wall frame and one or more electrically conductive members arranged generally perpendicular to the side wall frame.

In embodiments in which one or more additional electrically conductive members are arranged generally parallel to the side wall frame, the additional electrically conductive member may protrude from a base frame. The additional electrically conductive member may be integral with the base frame, detachedly attached to the base frame, or fixedly attached to the base frame.

The additional electrically conductive members may each comprise a ring. If these rings are arranged in a stack, one on top of the other, so that each is spaced apart a distance from its neighbour, a ring shaped cavity is formed between adjacent rings of the stack.

The electrically conductive members of the counter electrode may each protrude from the side wall frame so that the side wall frame closes one side of each of the ring-shaped cavities formed between pairs of electrically conductive members. Each cavity has one open side which is in communication with the plasma chamber so that the plasma within the plasma chamber can also extend into and form within each cavity.

The above embodiments, the counter electrode has stacked cavities or tangential cavities. In further embodiments, the counter electrode has a plurality of cavities arranged in a single layer.

In an embodiment, a plurality of additional electrically conductive members are provided which extend radially from the side wall frame of the counter electrode. A cavity is defined between each of the radially extending electrically conductive members.

If the side wall frame is circular in plan view, the cavities narrow towards their apex. The radially extending electrically conductive members may also be termed ribs and may also extend towards the centre of the vacuum chamber so that they do not cross the line of sight between the edge of the target and the edge of the substrate or substrate holder.

The additional electrically conductive members of the counter electrode may extend from a cover frame to a base frame of the counter electrode. In this embodiment, the base frame and the cover frame are positioned on opposing sides of the electrically conductive members and close opposing sides of the cavities whose lateral extent is defined by adjacent electrically conductive members. The cavities of the counter electrode may have a generally trapezoidal shape.

The counter electrode may be shaped so as have a surface area Ac within the vacuum chamber. If the first electrode has a surface area At within the vacuum chamber, Ac≧At In further embodiments the ratio of Ac to At is at least 10:1 to avoid sputtering off from the counter electrode.

The first electrode may comprise a target of material to be sputtered. The RF sputtering arrangement may include two or more targets each of which can comprise a different composition and may be sputtered individually. The RF sputtering apparatus may be used to sputter films of differing composition by forming a applying a RF electric field across the desired target and the counter electrode so as to ignite a plasma between the desired target and the counter electrode and sputter material from the desired target onto the substrate.

The RF sputtering apparatus may also comprise at least one channel for pumping out the vacuum chamber and/or supplying gas to the vacuum chamber. The channel or channels may be provided in various positions. In embodiment, one or more channel is arranged between the first electrode and the cover and/or between the substrate and the base and/or in the side wall.

The apparatus for sputtering may also be used for magnetron sputtering in addition to RF sputtering and may also be used for RF magnetron sputtering.

For magnetron sputtering, the apparatus is provided with at least one magnet positioned adjacent a second surface of the first electrode, the second surface opposing the first surface of the first electrode that defines a portion of the vacuum chamber. The magnet is typically arranged behind the target adjacent the side of the target that is averted to the target surface that is sputtered.

The magnet or magnets may be fixed in position or may be rotatable.

The strength and position of the magnet may be chosen so that the magnetic field experienced by the counter electrode is sufficiently low that sputtering from the counter electrode or from portions of the counter electrode is not encouraged.

The counter electrode according to one of the embodiments described above can also be described as having a corrugated form comprising a plurality of protrusions or ribs interleaved with cavities or indentations. The cavities or indentations may also be formed by the arrangement of the side wall frame and ribs and in further embodiments by the base frame, side wall frame and a rib and the cover frame, side wall frame and a rib.

The corrugated form of the counter electrode increases the surface area of the counter electrode so as to discourage sputtering of the material forming the counter electrode since the plasma can be formed and exists in the indentations of cavities. This increases the charge exchange between the plasma and counter electrode.

Embodiments will now be described with reference to the drawings.

Figure 1:
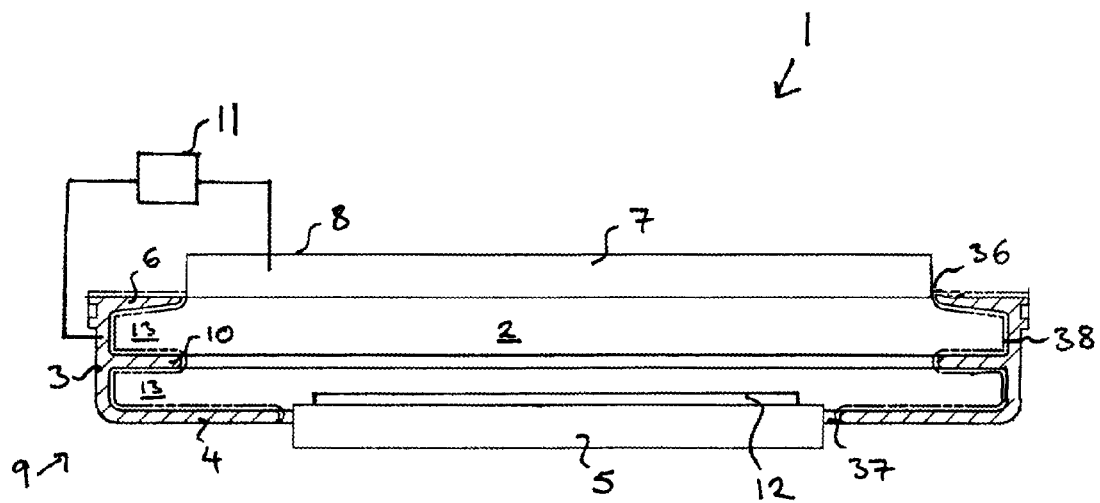
FIG. 1 illustrates a RF sputter arrangement with a counter electrode comprising tangential cavities.

FIG. 1 illustrates a RF sputter arrangement 1 according to a first embodiment. The RF sputter arrangement comprises a vacuum chamber 2 with a substrate holder 5 and a target 7 of material to be sputtered. In this embodiment, the vacuum chamber 2 is generally circular in plan view. However, the RF sputtering apparatus is not limited to said circular form.

The target 7 and substrate holder 5 are arranged generally parallel to one another and spaced at a distance from one another. A plasma is formed in the region between the target 2 and the substrate holder 5.

Target 7 comprises a first electrode 8, which may be a cathode. The counter electrode 9 comprises a side wall frame 3, a base frame 4, a cover frame 6 and an additional electrically conductive member 10 positioned between the base frame 4 and cover frame 6. The side wall frame 3, base frame 4, cover frame 6 and additional electrically conductive member 10 are mechanically connected to one another and electrically connected to ground and thus jointly act as a counter electrode 9. If the target 7 is a cathode, the counter electrode 9 is an anode and vice versa. An electric RF field is applied across the first electrode 8 and counter electrode 9 to ignite a plasma between the first electrode 8 and counter electrode 9.

Figure 3:
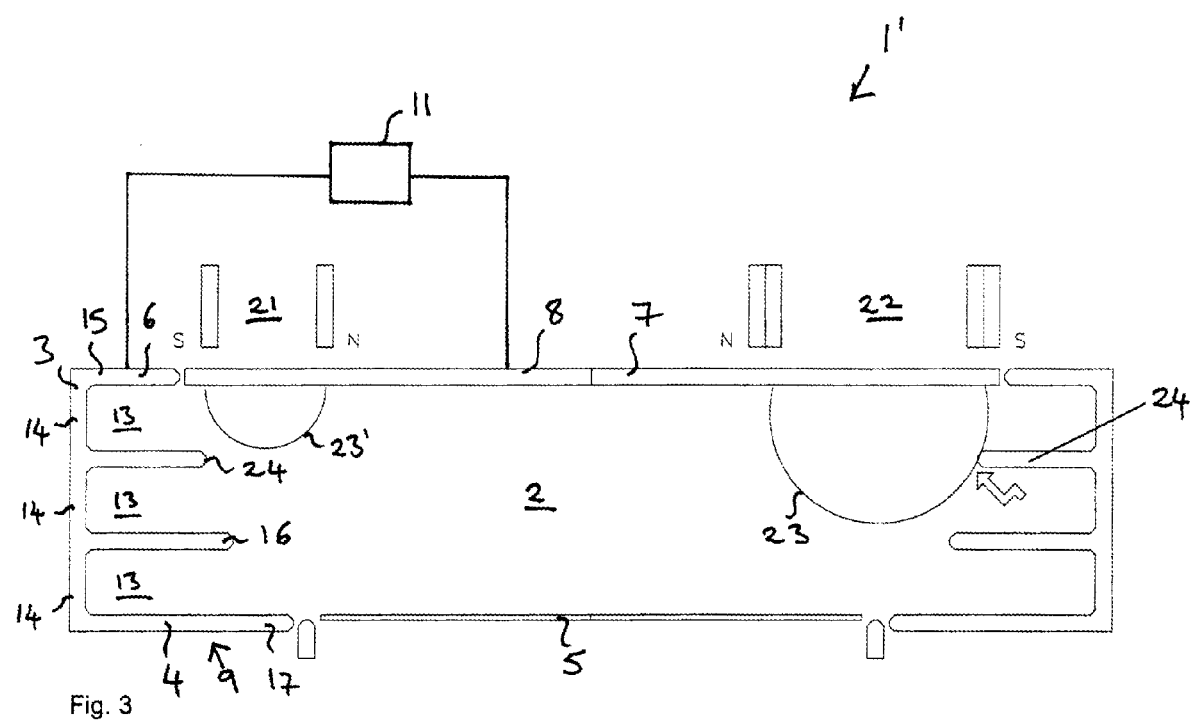
FIG. 3 illustrates the arrangement of magnets in a RF sputter arrangement according to a second embodiment.

The RF sputter arrangement 1 further includes a RF generator 11 for generating an RF plasma between the first electrode 8 and the counter electrode 9 and, optionally, magnetic field generating means for generating a magnetic field adjacent the surface of the target 7 facing away from the substrate holder 5. An embodiment with magnetic field generating means for the target 7 is illustrated in FIG. 3.

A non-illustrated shield may be used to fix a substrate 12, e.g. a semiconductor wafer, onto which a layer of material from the target 7 is to be deposited, to the substrate support 5 during operation of the RF sputter arrangement 1. The shield may have the same potential as the substrate 12 or have a floating potential.

The additional electrically conductive member 10 is introduced in order to increase the active area of the counter electrode 9. In this embodiment, the additional electrically conductive member 10 comprises an aperture-like piece of metal, for example an annular metal ring, which is integral with, and electrically conductively connected to, the sidewall frame 3.

The counter electrode 9 can be described as having a corrugated form with two or more cavities 13 defined by the protruding portions, which may be termed ribs, of the corrugated form.

Figure 2:
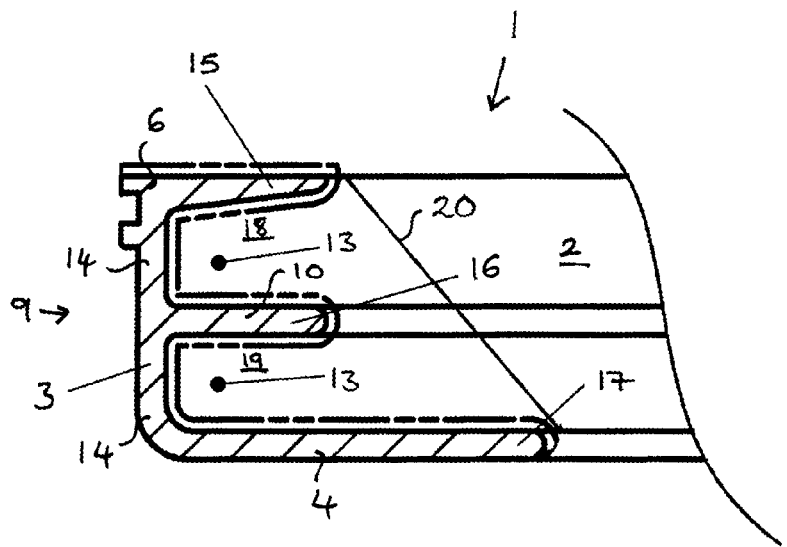
FIG. 2 illustrates a detailed view of the counter electrode of FIG. 1.

A detailed view of the counter electrode 9 is illustrated in FIG. 2. The counter electrode 9 comprises a outer, surrounding frame part 14, provided by the side wall frame 3, and three ribs 15, 16, 17 that are arranged in generally parallel, spaced apart planes and perpendicular to side wall frame 3. The ribs 15, 16, 17 each comprise the shape of circular rings with a common central axis. The width of said circular rings may vary. The upper rib 15 may provide the cover frame 6 and the lower rib 17 may provide the base frame 4 of the counter electrode 9.

In the embodiment illustrated in FIGS. 1 and 2, the upper ring 15 and centre ring 16 providing the upper rib 15 and centre rib 16, respectively, have approximately the same width. The lower ring 17 has a larger width and extends further towards the centre of the vacuum chamber 2 than the upper rib 15 and centre rib 16. The lower rib 17 may extend to the outermost surface of the substrate.

The ribs 15, 16, 17 and a respective portion of frame 14 provide the spatial boundaries defining two ring-shaped circular cavities 18, 19. The lower surface of the upper rib 15, upper surface of the centre rib 16 and the side wall frame 14 extending between the lower surface of the upper rib 15 and the upper surface of the centre rib 16 define the first ring-shaped cavity 18 of the counter electrode 9. The lower surface of the centre rib 16, upper surface of the lower rib 17 and the side wall frame 14 extending between the lower surface of the centre rib 16 and the upper surface of the lower rib 17 define the second ring-shaped cavity 19 of the counter electrode 9.

The "width" of cavity 19 is determined by the distance between lower surface of the centre rib 16 and the upper surface of the lower rib 17. The "depth" of the cavity 19 is defined by the width of the respective smaller circular ring, in this case the centre rib 16. The "bottom" of the cavity 19 is a formed by a part of frame 14 provided by the side wall 3. The cavity 19 is open on one side, that is the side opposite the side wall frame 3, and communicates with the vacuum chamber 2.

The cavities 18, 19 are dimensioned so that a plasma can be formed within the cavity 18, 19. The dimensions required to achieve this depend on the range of sputtering conditions used to deposit material from the target 7 onto the substrate.

In one embodiment, the target 7 may have a 300 mm diameter and the substrate a 200 mm diameter. A target-substrate distance of approx. 50 mm may be used achieve a good uniformity and reasonable target utilization. This distance limits the number of ribs that can be added to the height of the entire counter electrode 9 arrangement. If the counter electrode 9 is designed to work at a low pressure of 0.1 Pa the width of the cavities should be approx. 15 mm to allow the plasma to enter.

In the embodiment illustrated in FIG. 1 the substrate diameter is 200 mm and the respective target 7 diameter is 300 mm. The distance between target 7 and substrate 12 is chosen to be around 50 mm allowing three ribs 15, 16, 17 for the counter electrode 9 arrangement. The outer, overall diameter of the counter electrode 9 arrangement is 370 mm. The width of the cavities is between 20-35 mm and 50-85 mm. The height of the cavities 18, 19 which is defined by the distance between surfaces of adjacent ribs that face one another is between 15-20 mm. The rib width which defines the depth of cavity 18, 19 may also be chosen so that the counter electrode 9 does not obstruct the line of sight 20 between edge of the target 7 and the edge of the substrate.

The deposition environment provided by the RF sputtering arrangement 1 comprises a single piece corrugated counter electrode 9 having also the function of protecting the vacuum chamber from coating of the sputtered material. A single piece electrode has the advantage of a well defined electrical potential, which is usually ground. It is also easy in maintenance, since it can be disassembled, removed and cleaned in one piece.

Gas supply may be provided by a proper gas manifold. Gas exchange may be performed via a slit near the target 36, and/or via a slit near the substrate 37 and/or by additional holes manufactured into the electrode body 38.

In some embodiments, the RF sputter arrangement is an RF magnetron sputtering arrangement and includes additional magnetic field generating means. The magnetic field generating means is arranged adjacent the target 7 outside of the region of the vacuum chamber 2 in which the plasma is formed. The magnetic field generating means is positioned adjacent the second surface of the target 7 that opposes the first surface that defines the vacuum chamber and faces the substrate holder 5.

FIG. 3 illustrates a RF magnetron sputtering arrangement 1' according to a second embodiment that comprises a rotating magnet 21 arranged behind the target 7, that is adjacent the side of the target 7 averted from the vacuum chamber 2. The RF sputtering arrangement 1' is generally the same as that of the first embodiment illustrated in FIGS. 1 and 2, but differs in the number of ribs and cavities provided by the counter electrode. In this embodiment, the counter electrode comprises four ribs which define three cavities.

The deposition rate of a RF sputtering arrangement 1' with such a magnet arrangement is typically 10 times higher as compared to sputtering without a magnet and the required counter electrode area may also be reduced as described in GB2191787 which is herein incorporated by reference in its entirety.

The magnet system 21 may be chosen to avoid sputtering from the counter electrode 9. Magnets with a wide dipole and high strength may tend to cause sputtering from the counter electrode 9 and, in particular, from portions of the counter electrode 9 close to the magnet 21.

FIG. 3 also illustrates this effect schematically. The right hand side of FIG. 3 illustrates a comparison wide distance magnet set 22 with strong magnets. The magnetic field, illustrated with a line 23, crosses the tip of a rib 24 of the counter electrode 9, which, consequently, is likely to be sputtered.

The left hand side of FIG. 3 illustrates a rotatable magnet 21 with a smaller dipole and less strength than that of the comparison magnet 22 so that the magnetic field illustrated with the line 23' fails to cross the rib 24 of the counter electrode 9. This avoids sputtering of material from the rib 24.

The strength of the magnet may be adjusted by putting less permanent block magnets into the assembly, as indicated in FIG. 3.

A suitable magnet construction is selected to achieve successful sputtering with a corrugated counter electrode 9 having one or more ribs positioned between the cover 6 and the base 4. In an embodiment, the narrow dipole magnet 21 with a field strength of about 150 Oe above the target 7 (measured about 5 mm above target surface) may be used to provide good results in which the counter electrode 9 and, in particular, the edge of the rib 24 is either not sputtered at all or is not noticeably sputtered as measured by the deposited layer. In contrast, the comparison magnet 22 with 300 Oe leads to sputtering of the rib edge 24.

In the embodiment, illustrated in FIG. 3, the counter electrode 9 has four ribs 15, 16, 17, 24 each protruding generally perpendicularly from a side wall frame 3 and having a generally annular form and being arranged generally parallel to, and spaced at a distance from, one another. The ribs 15, 16, 17, 24 are arranged generally parallel to the target 7 and substrate holder 5.

The counter electrode 9 may have other shapes of cavity other than annular cavities as in the first embodiment. The counter electrode 9 may also have radial cavities in addition to, or in place of, the tangential cavities of the counter electrode illustrated in FIGS. 1, 2 and 3.

Figure 4:
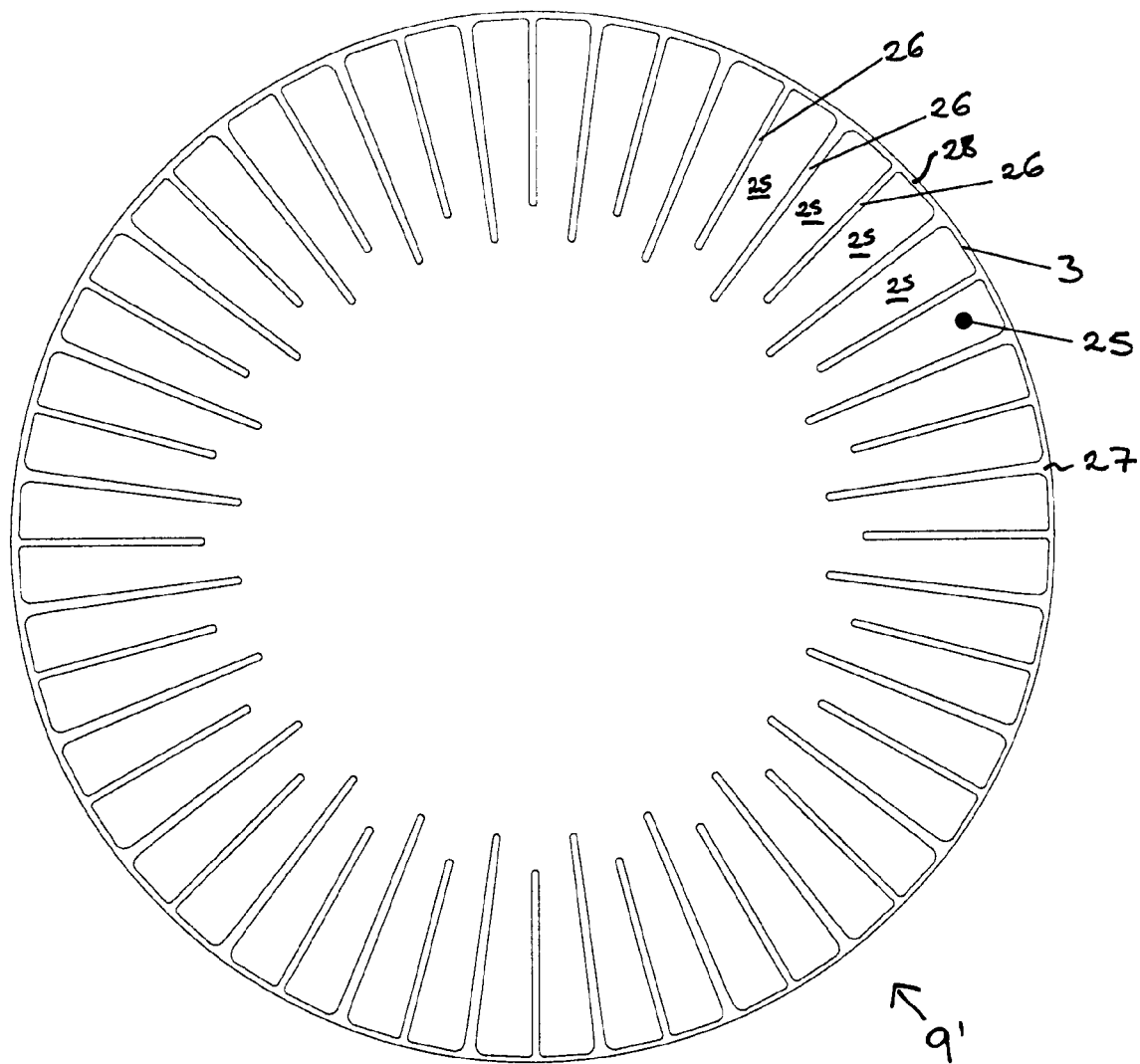
FIG. 4 illustrates a cross-section of a counter electrode according to a third embodiment.
Figure 5:
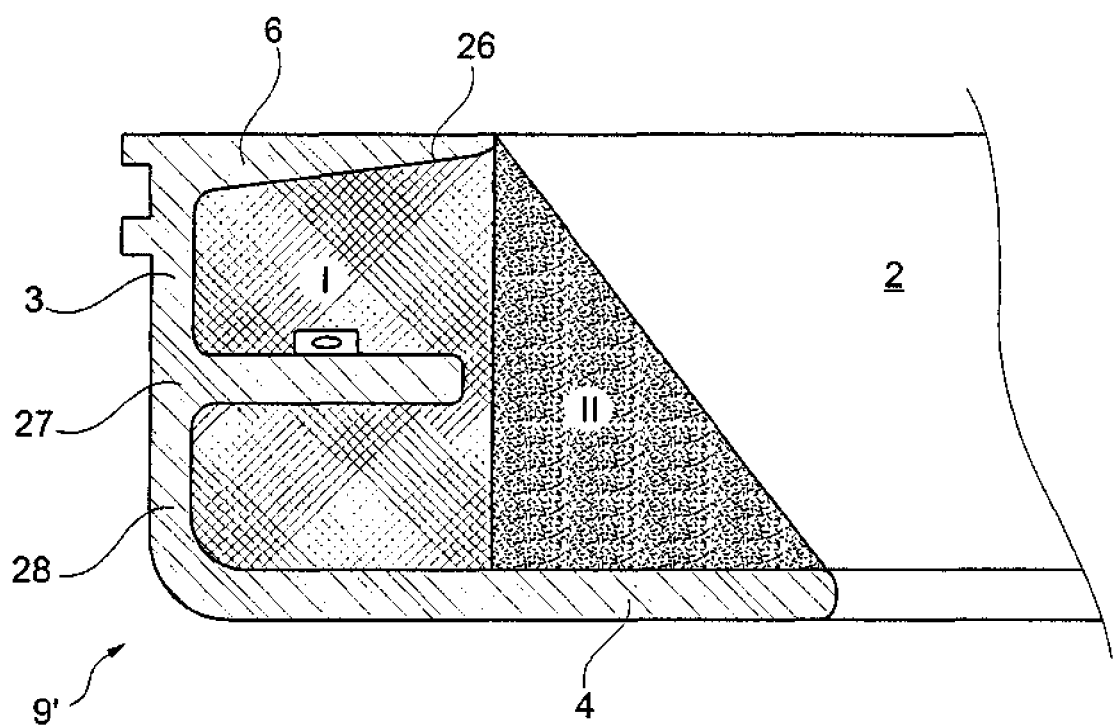
FIG. 5 illustrates a cross-section of the counter electrode of FIG. 4.

FIG. 4 illustrates a cross-section of a centre plane of a generally ring-shaped counter electrode 9' of a non-illustrated RF sputtering arrangement according to a third embodiment. The counter electrode 9' comprises radial cavities 25 defined by a plurality of ribs 26 which extend perpendicularly from the inner surface of a circular side wall frame 3 radially towards the centre of the vacuum chamber 3. FIG. 5 illustrates a detailed side view of the counter electrode 9' of FIG. 4.

In the view of FIG. 4, substrate holder 5 and target 7 are arranged parallel to the plane of projection as shown in FIG. 4, i.e. above an below the plane of the counter electrode 9' illustrated in FIG. 4. The ribs 26 extend in a direction parallel to the major surfaces of the substrate holder 5 and the target 7.

The ribs 26 extend from the outer, surrounding circular frame part 27 radially inwards. The distance between neighbouring apices of ribs 26 obeys the same dimensional conditions as those described above since the plasma should be able to enter the cavities 25 in order to allow charge exchange to the extended surface area of the counter electrode 9' provided by the cavities 25. This ability depends, amongst others, from plasma power, the magnetic field or magnetic fields, if provided, and the pressure in the plasma chamber.

The surrounding frame part 27 again constitutes a frame and forms the base 28 of the cavities 25. A base frame 4 and a cover frame 6 form the base and cover of the cavities 25. The height of the ribs 26 provides the side walls of the cavities 25.

Neighbouring ribs 26 have differing lengths. Every second rib has the same length. Therefore, the arrangement can be thought of as having two pluralities of ribs, one plurality being longer than the other. The individual ribs of the two pluralities of ribs are arranged alternately to give a long rib, short rib, long rib, short rib arrangement.

In the plane of the substrate holder 5 and target 7 the radial cavities 25 are closed by portions of the base frame 4 and cover frame 6 as illustrated in the cross-sectional view of FIG. 5. FIG. 5 illustrates a side view along a cross-sectional through a rib 26 of the embodiment illustrate in FIG. 4. Other features of the RF sputtering arrangement illustrated in FIGS. 4 and 5 are the same as those illustrated for the embodiments illustrated in FIGS. 1, 2 and 3. The embodiments differ in the shape of the counter electrode.

Figure 6:
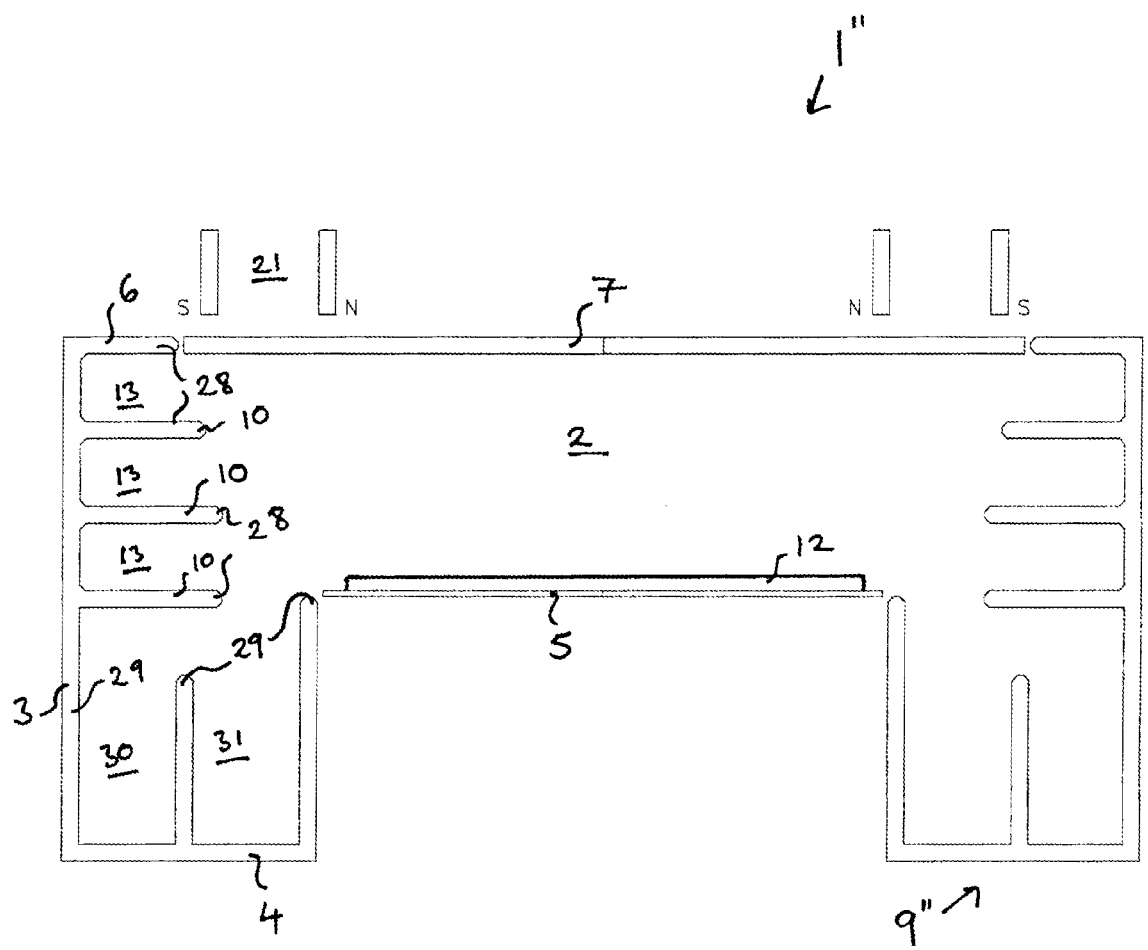
FIG. 6 illustrates an RF sputter arrangement according to a fourth embodiment comprising compartments extending below the substrate plane.

FIG. 5 illustrates the counter electrode 9' comprises the surrounding frame part 27, cover frame 6 and base frame 4. One of the radial ribs 26 is represented by the shaded area I. The cover frame 6 and base frame 4 close all ribs 26 of the arrangement shown in FIG. 4 to form cavities 25 which are open on one side, in particular, the side opposite the frame 27, and communicate with the vacuum chamber 3. The cover frame 6 and base frame 4 are arranged perpendicular to ribs 26. In a further embodiment the radial ribs 26 can be shaped to include areas I and II, as shown in FIG. 6. In other words the boundary line of such a rib with a trapezoidal form remains within and does not cross the line of sight 20 that extends between the edge of the target 7 and the edge of the substrate 12 or substrate holder 5.

FIG. 6 illustrates a RF sputtering arrangement 1" according to a fourth embodiment. The RF sputtering arrangement 1" according to the fourth embodiment comprises a counter electrode 9" comprising a first plurality of ribs 28 each having a generally annular form and being arranged generally parallel to, and spaced at a distance from, one another. The ribs 28 are arranged generally parallel to the target 7 and substrate holder 5 and protrude perpendicularly to the side wall frame 3. The ribs 28 have the arrangement of the embodiments illustrated in FIGS. 1 to 3.

The RF sputtering arrangement 1" also comprises a second plurality of ribs 29 which extend parallel to the side wall frame 3 to define compartments 30, 31 positioned adjacent the substrate holder 5 and beneath the plane of the substrate holder 5. In this embodiment, the side wall frame 3 and the second plurality of ribs 29 are circular. Each rib 29 has the shape of an annular ring and is positioned generally perpendicularly to the ribs 28. The compartments 30, 31 are used for plasma expansion. This arrangement of the second plurality of ribs 29 can be used to further increase the surface area of the counter electrode 9" without increasing the target 7 to substrate 12 distance to accommodate further ribs 28 extending parallel to the substrate since the second plurality of ribs 29 are accommodated adjacent and beneath the plane of the substrate holder 5 and substrate 12.

A portion of the side wall frame 3 can form one of the second plurality of ribs 29. The compartments 30, 31 are generally circular in plan view and arranged perpendicularly to the circular cavities 25 formed by the first plurality of ribs 28. The compartments 30, 31 provide two annular ring-shaped cavities positioned between the side wall frame 3 and the substrate holder 5 so that the inner compartment 31 defines the extent of the substrate holder 5. The substrate holder 5 is circular and defined by a single plane without indentations. The first plurality of ribs 28 and second plurality of ribs 29 are integral with, and electrically connected to, one another and the side wall frame 3 so as to provide a single counter electrode 9".

The compartments 30, 31 and the cavities 25 are dimensioned so that a plasma can form within each compartment 30, 31 and each cavity 25.

The embodiments illustrated in FIGS. 4 to 6 may also have arrangements of magnets having differing strengths as illustrated in FIG. 3. These magnets may be rotatable and are arranged adjacent the second surface of the target 7.

In summary, the RF sputter arrangement comprises a corrugated counter electrode, realized with ribs and/or blind holes, that is holes that are closed at one end and open to the plasma chamber at a further side. The dimensions of the corrugation are selected such that the plasma is able to enter the cavities in order to allow charge exchange to the extended surface area of the counter electrode provided by the corrugation of ribs and cavities. The ability of the plasma to enter a cavity depends on its geometrical dimensions, its entrance slits and the pressure of the desired plasma process.

A single piece corrugated electrode may ease maintenance and cleaning. The magnetic field for RF magnetron sputtering needs to have a proper design with respect to the shields and preferably a low field strength of typically 150 Oe or less to avoid sputtering of the counter electrode.

Figure 7:
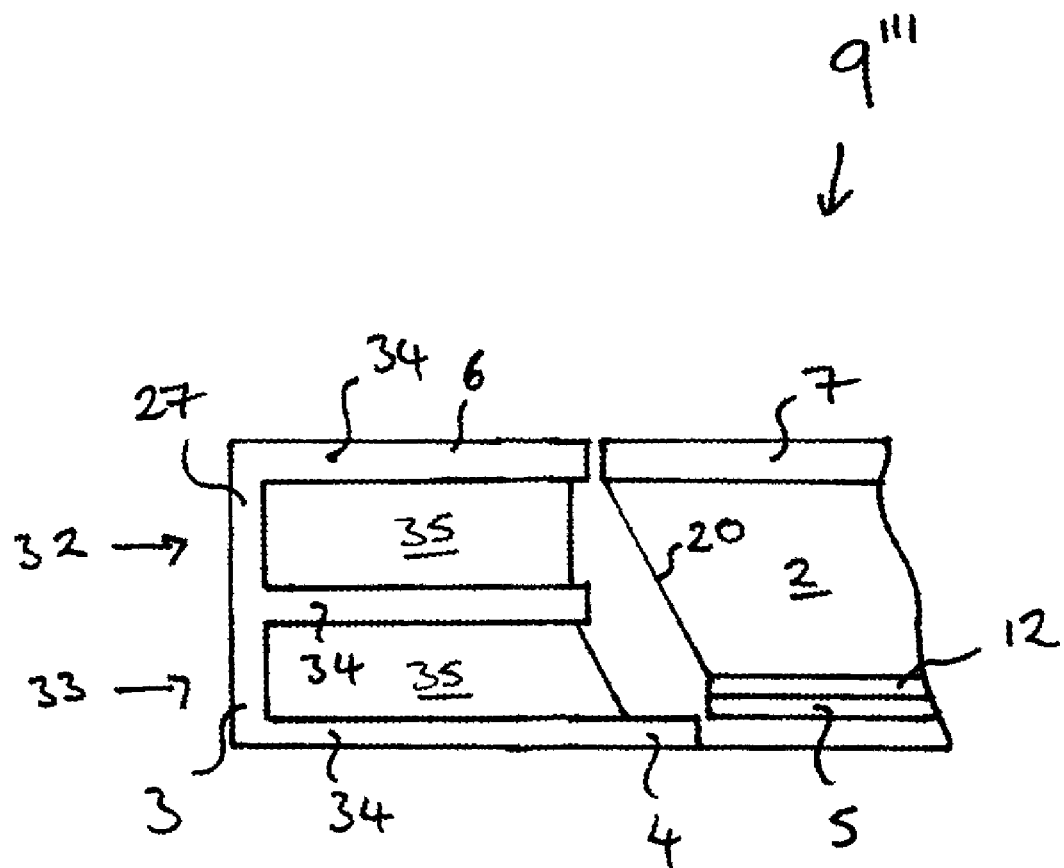
FIG. 7 illustrates an RF sputter arrangement according to a fifth embodiment.

A combination of the counter electrode 9 and 9″ of the embodiments illustrated in FIGS. 1 and 5 may be used and provides a counter electrode 9‴ having a combination of tangential and radial cavities. A RF sputtering apparatus 1‴ comprising this counter electrode 9‴ is illustrated in FIG. 7.

The counter electrode 9‴ has a sandwich type structure in which two layers 32, 33 of radially extending ribs 34 are interleaved with annular ring-shaped ribs 34 to produced two layers of cavities 35 arranged one on top of the other.

This results in rectangular blind hole cavities 35 directing from the plasma environment outwards. These blind hole cavities 35 will most effectively generate area for charge exchange with the plasma. However, they may increase high manufacturing costs. In this case the counter electrode 9‴ may be assembled out of two or more pieces in order to enable the manufacturing of complicated cavities.

The side wall frame 3, cover frame 6 and base frame 4 of the counter electrode 9 according to one of the embodiments described above may have dimensions so as to follow the form of and line the side wall, base and cover that define the vacuum chamber in which the plasma is formed and sputtering takes place. The counter electrode 9 may also be electrically connected to the side wall, base and/or cover defining the vacuum chamber if the counter electrode is connected to ground.

The counter electrode may comprise a metal or alloy sheet which can be formed by stamping, cutting or bending to provide the desired shape. Several pieces of metal or alloy sheet may be joined together by welding, for example, to provide the desired shape of the counter electrode.

The invention claimed is:

1. Apparatus for sputtering, comprising:
a vacuum chamber defined by at least one side wall, a base and a cover;
at least one first electrode having a first surface arranged in the vacuum chamber;
a counter electrode having a surface arranged in the vacuum chamber, and
a RF generator, the RF generator being configured to apply a RF electric field across the at least one first electrode and the counter electrode so as to ignite a plasma between the first electrode and the counter electrode, wherein
the counter electrode comprises at least two cavities in communication with the vacuum chamber, the cavities each having dimensions such that a plasma can be formed in the cavity, the counter electrode comprises a side wall frame and at least three additional electrically conductive members defining the at least two cavities, the counter electrode is arranged in peripheral regions of the vacuum chamber, the additional electrically conductive members protrude from the side wall frame, the additional electrically conductive members are arranged spaced at a distance and generally parallel to one another, the additional electrically conductive members each comprises a ring, and the cavities are ring-shaped.

2. The apparatus for sputtering according to claim 1, wherein,
the counter electrode comprises at least a portion of the side wall and/or the base of the vacuum chamber and/or the cover and one or more of the additional electrically conductive members.

3. The apparatus according to claim 1, wherein the counter electrode is arranged out of line of sight of the first electrode to a substrate.

4. The apparatus according to claim 1, wherein the number of cavities is equal to the number of additional electrically conductive members minus 1.

5. The apparatus according to claim 1, wherein at least one additional electrically conductive member is arranged generally parallel to the side wall frame.

6. The apparatus according to claim 5, wherein the at least one additional electrically conductive member protrudes from a base frame of the counter electrode.

7. The apparatus according to claim 1, wherein the counter electrode has a surface area Ac and the first electrode has a surface area At, wherein Ac≧At.

8. The apparatus according to claim 1, wherein the first electrode comprises a target of material to be sputtered.

9. The apparatus according to claim 1, wherein a channel for pumping out the vacuum chamber and/or supplying gas to the vacuum chamber is arranged between the first electrode and the cover and/or between a substrate and the base and/or in the side wall.

10. The apparatus according to claim 1 further comprising at least one magnet positioned adjacent a second surface of the first electrode, the second surface opposing the first surface of the first electrode.

11. The apparatus according to claim 10, wherein the magnet is rotatable.

12. Apparatus for sputtering, comprising:
a vacuum chamber defined by at least one side wall, a base and a cover;
at least one first electrode having a first surface arranged in the vacuum chamber;
a counter electrode having a surface arranged in the vacuum chamber, and
a RF generator, the RF generator being configured to apply a RF electric field across the at least one first electrode and the counter electrode so as to ignite a plasma between the first electrode and the counter electrode, wherein
the counter electrode comprises at least two cavities in communication with the vacuum chamber, the cavities each having dimensions such that a plasma can be formed in the cavity, wherein the counter electrode is arranged in peripheral regions of the vacuum chamber, the counter electrode comprises a side wall frame and at least three additional electrically conductive members defining the at least two cavities, the additional electrically conductive members protrude from the side wall frame, and the additional electrically conductive members extend radially from the side wall frame.

13. The apparatus according to claim 12, wherein the counter electrode has a surface area Ac and the first electrode has a surface area At, wherein Ac≧At.

14. The apparatus according to claim 12, wherein the first electrode comprises a target of material to be sputtered.

15. The apparatus according to claim 12, wherein a channel for pumping out the vacuum chamber and/or supplying gas to the vacuum chamber is arranged between the first electrode and the cover and/or between a substrate and the base and/or in the side wall.

16. The apparatus according to claim 12 further comprising at least one magnet positioned adjacent a second surface of the first electrode, the second surface opposing the first surface of the first electrode.

17. The apparatus according to claim 16, wherein the magnet is rotatable.

18. The apparatus according to claim 12, wherein the additional electrically conductive members extend from a cover frame to a base frame of the counter electrode.

19. The apparatus according to claim 12, wherein the cavities have a generally trapezoidal shape.

* * * * *